(12) United States Patent
Adler

(10) Patent No.: US 6,667,539 B2
(45) Date of Patent: Dec. 23, 2003

(54) METHOD TO INCREASE THE TUNING VOLTAGE RANGE OF MOS VARACTORS

(75) Inventor: Eric Adler, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 231 days.

(21) Appl. No.: 09/683,014

(22) Filed: Nov. 8, 2001

(65) Prior Publication Data

US 2003/0085449 A1 May 8, 2003

(51) Int. Cl.[7] ................................................ H01L 29/93
(52) U.S. Cl. ........................ 257/595; 257/312; 257/598; 257/600; 257/601; 438/379
(58) Field of Search ................................. 257/595, 598, 257/600, 601, 312; 331/177 V, 117 FE; 438/379

(56) References Cited

U.S. PATENT DOCUMENTS

| | | | |
|---|---|---|---|
| 3,582,823 A | | 6/1971 | Pasos |
| 3,675,161 A | * | 7/1972 | Teramoto et al. ............ 332/130 |
| 4,065,723 A | | 12/1977 | Endres et al. |
| 4,195,274 A | | 3/1980 | Suganuma |
| 4,338,582 A | | 7/1982 | Presser |
| 4,450,416 A | | 5/1984 | Mears |
| 4,458,215 A | | 7/1984 | Huang et al. |
| 4,670,722 A | | 6/1987 | Rauscher |
| 4,786,828 A | * | 11/1988 | Hoffman ...................... 327/566 |
| 4,855,801 A | | 8/1989 | Kuesters |
| 5,028,894 A | | 7/1991 | Speake |
| 5,038,184 A | | 8/1991 | Chiang et al. |
| 5,166,646 A | | 11/1992 | Avanic et al. |
| 5,173,835 A | | 12/1992 | Cornett et al. |
| 5,405,790 A | | 4/1995 | Rahim et al. |
| 5,600,187 A | | 2/1997 | El-Hamamsy et al. |
| 5,965,912 A | | 10/1999 | Stolfa et al. |
| 6,100,770 A | | 8/2000 | Litwin et al. |
| 6,407,412 B1 | * | 6/2002 | Iniewski et al. ............. 257/107 |
| 6,521,939 B1 | * | 2/2003 | Yeo et al. .................... 257/312 |
| 6,566,971 B1 | * | 5/2003 | Gutierrez .................... 331/167 |

FOREIGN PATENT DOCUMENTS

JP          03190413 A    *   8/1991

* cited by examiner

Primary Examiner—Minhloan Tran
Assistant Examiner—Remmon R. Fordé
(74) Attorney, Agent, or Firm—Wood, Phillips, Katz, Clark & Mortimer

(57) ABSTRACT

A varactor circuit having an increased tuning range comprises a first varactor in series with a second varactor between first and second terminals. A resistor is connected between the first and second terminals. A tap of the resistor is connected to a junction of the first and second varactors. This circuit effectively doubles tuning range compared to a single varactor.

20 Claims, 3 Drawing Sheets

METHOD TO INCREASE THE TUNING VOLTAGE RANGE OF MOS VARACTORS

BACKGROUND OF THE INVENTION

Variable capacitors have long been used in tuning circuits in connection with a fixed inductor for tuning a time constant. Originally, the variable capacitance was provided using an electromechanical device. For example, a rotary knob could be manually rotated to vary capacitance in the tuning circuit. More recently, electrically controlled variable capacitors, also known as varactors, have found widespread acceptance.

One type of varactor is a varactor diode which uses a barrier voltage at a reverse-bias junction to enable the junction to serve as a capacitance because of the separated charges in a depletion zone. The amount of junction capacitance can be electrically controlled using the reverse voltage. The capacitance changes as the depletion zone is made wider or narrower by changes in voltage.

Another type of variable varactor is a metal oxide silicon (MOS) type varactor. A MOS varactor uses an insulator layer over a semiconductor element with a gate electrode over the insulator layer to form the varactor. MOS varactors have a large amount of tunability over a narrow range of voltage. This results in a device which may be too sensitive for many applications. The effective tuning voltage range is restricted to approximately the silicon band gap of 1.2 volts. When noise factors are introduced, the problems are worsened.

The present invention is directed to solving one or more of the problems discussed above in a novel and simple manner.

BRIEF SUMMARY OF THE INVENTION

In accordance with the invention there is provided a variable voltage capacitor having an increased tuning range.

Broadly, there is disclosed herein a varactor circuit having an increased tuning range comprising a first varactor in series with a second varactor between first and second terminals. A resistor is connected between the first and second terminals. A tap of the resistor is connected to a junction of the first and second varactors.

It is a feature of the invention that the varactors comprise MOS varactors. More particularly, the varactors comprise an N-FET in an N-well.

It is another feature of the invention that a diffusion of the first varactor is connected to a gate of the second varactor.

It is an additional feature of the invention that the first terminal is a gate of the first varactor and the second terminal is a diffusion of the second varactor.

It is still another feature of the invention that the resistor comprises a high-value resistor.

It is still a further feature of the invention that the resistor comprises first and second series connected resistors having a junction defining the tap.

There is disclosed in accordance with another aspect of the invention a MOS varactor device having increased tuning range and comprising a substrate. A first varactor element on the substrate has a gate and a diffusion. A second varactor element on the substrate has a gate and a diffusion. The first varactor element is connected in series with the second varactor element between first and second terminals. A resistor element is connected between the first and second terminals. A tap of the resistor element is connected to a junction of the first and second varactor elements.

There is disclosed in accordance with another aspect of the invention a variable capacitor having an increased tuning range including a first varactor in series with a second varactor between first and second terminals. A first resistor is in series with a second resistor connected between the first and second terminals. A junction of the first and second resistors is connected to a junction of the first and second varactors.

It is a feature of the invention that the first and second resistors have equivalent resistance.

Further features and advantages of the invention will be readily apparent from the specification and from the drawing.

DETAILED DESCRIPTION OF THE INVENTION

In accordance with the invention, a varactor circuit effectively doubles the tuning range and improves linearity because the change in capacitance relative to voltage is slower. This is accomplished using a variable voltage capacitor, also referred to as a varactor, in the form of a MOS device using a first varactor in series with a second varactor with a resistor connected across the first and second varactors, a tap of the resistor being connected to a junction of the first and second varactors.

Figure 1:
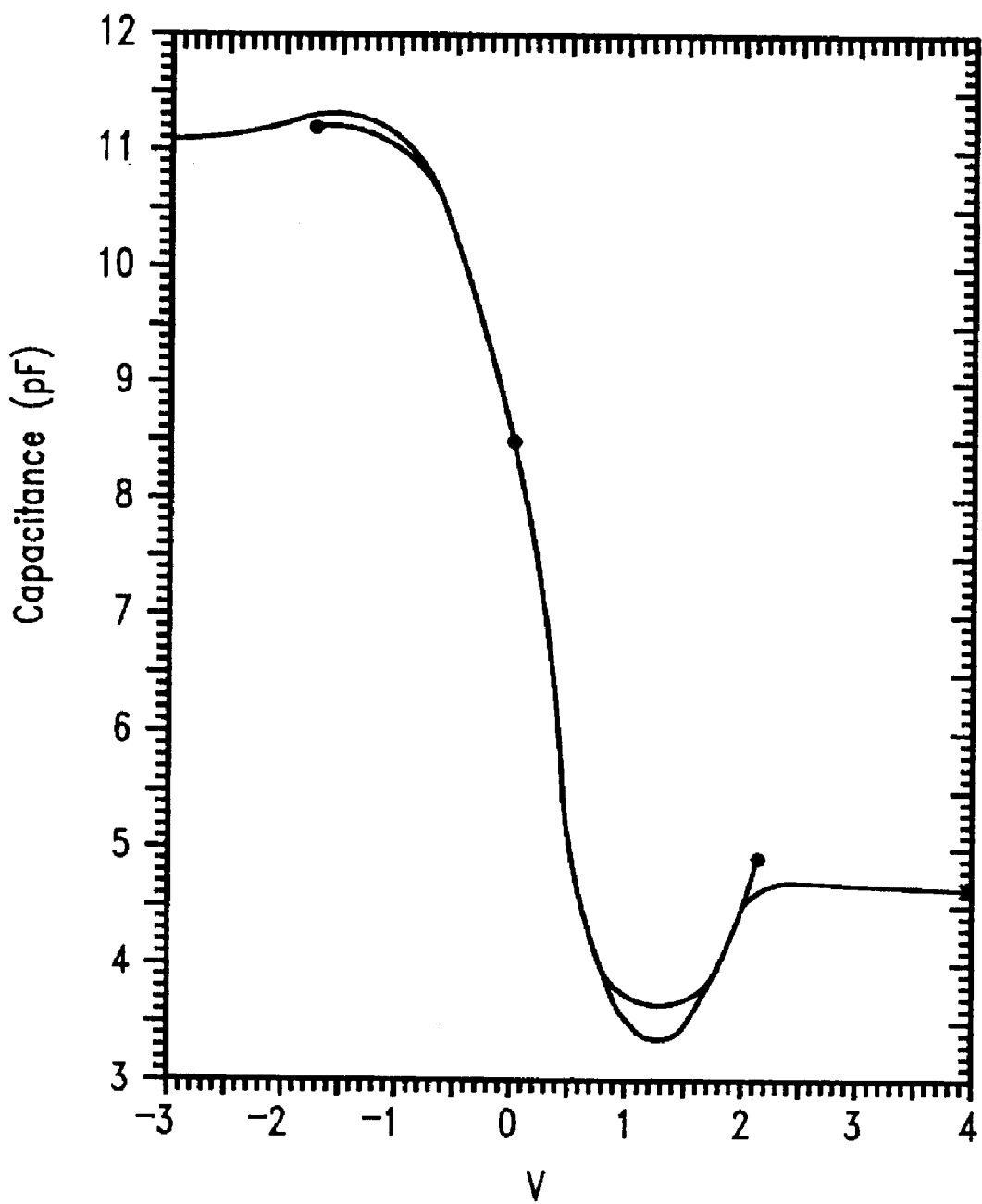
FIG. 1 is a graph illustrating electrical characteristics of a MOS varactor.

Referring initially to FIG. 1, a graph illustrates the electrical characteristics of a metal oxide silicon (MOS) varactor in the form of an N-FET in N-well varactor. As is apparent, a very large capacitance change is provided over a small voltage range. As a result, the effective tuning voltage range is approximately 1.2 volts. In accordance with the invention, the tuning range is effectively doubled by placing two MOS varactors in series. The MOS type is an N-FET in an N-well. As is apparent, other types of MOS varactors could be used to increase tuning range in accordance with the invention.

Figure 2:
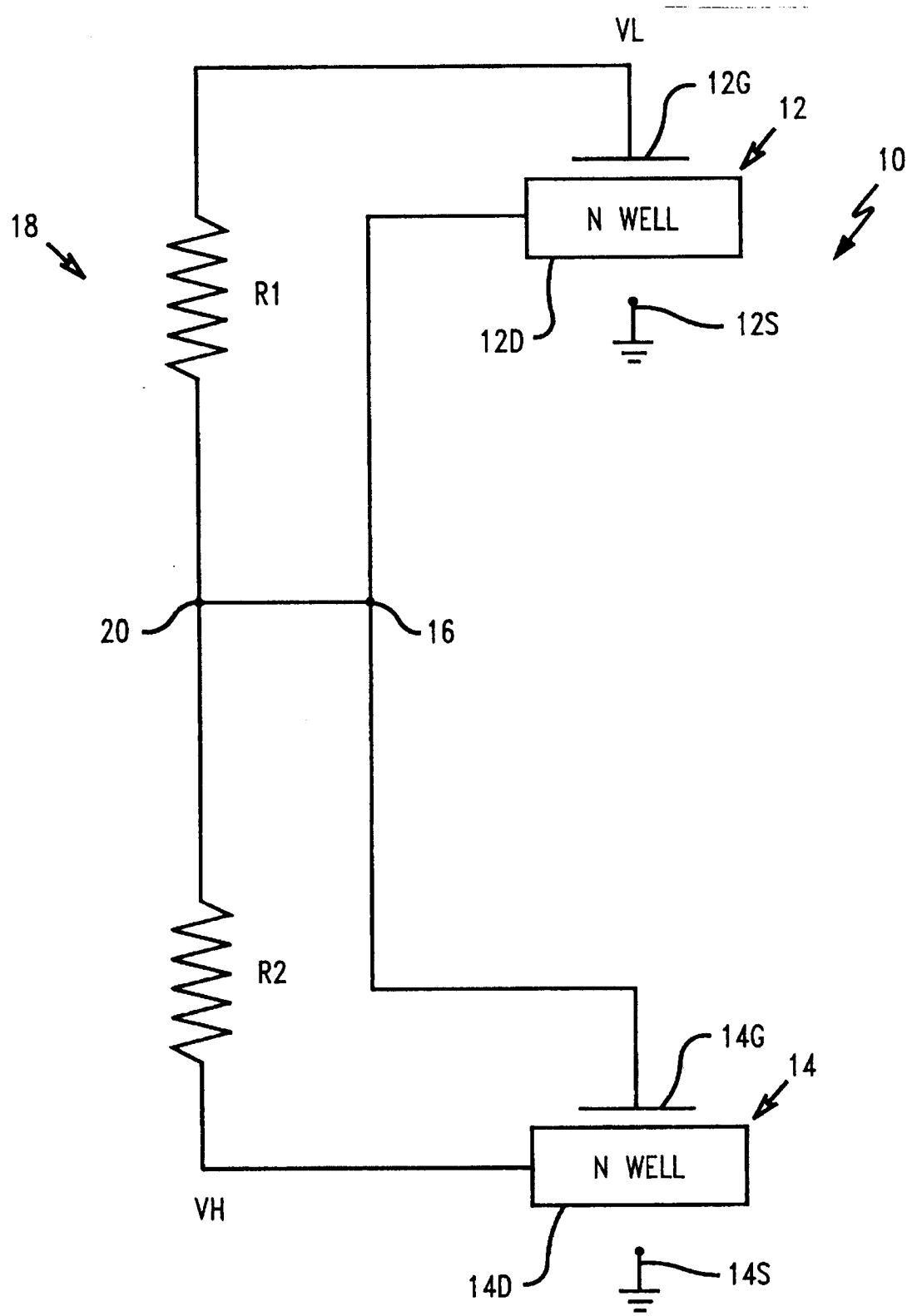
FIG. 2 is an electrical schematic of a varactor circuit having an increased tuning range in accordance with the invention.

Referring initially to FIG. 2, a schematic diagram of a varactor circuit 10 in accordance with the invention is illustrated. The varactor circuit 10 includes a first varactor 12 in series with a second varactor 14. The first varactor 12 includes a gate 12G, a diffusion 12D and a substrate 12S. Similarly, the second varactor 14 includes a gate 14G, a diffusion 14D and a substrate 14S. Advantageously, the substrates 12S and 14S comprise the same physical substrate. Each diffusion 12D and 14D is an N+ diffusion. The diffusion 12D of the first varactor 12 is connected to the gate 14G of the second varactor 14 to define a node 16 representing a junction between the two varactors 12, 14. The two terminals of the varactor circuit 10 are the gate 12G of the first varactor 12, labeled VL, and the diffusion 14D of the second varactor 14, labeled VH. If the two varactors 12, 14 in series are of equal size, then the total capacitance has the form:

$$Ctot(V)=C(V1)*C(V2)/(C(V1)+C(V2)) \quad [t1]$$

Assuming the connection between the first varactor 12 and the second varactor 14 is for all practical purposes isolated, so charge can only transfer between the two varactors 12, 14, then the charge Q1 on the first varactor 12 is equal to the charge Q2 on the second varactor 14. As a result, V1=V2=V/2. Thus, $$Ctot(V)=C(V2)/2 \quad [t2]$$

Therefore, the percentage change in Ctot(V) for a given change in V is equivalent to a change in the individual varactor associated with V/2. The linearity of the varactor circuit 10 is therefore improved by a factor of two.

With the above described arrangement, the node 16 has a leakage current to the substrate 12S, 14S. If the varactor circuit 10 is left with no other source of current, then the potential of the node 16 would gradually sink to the level of the substrate 12S, 14S destroying the function of the varactor circuit 10. Therefore, in accordance with the invention, a high value resistor 18 sized to restore the expected N-well leakage current is tied between the terminals VL and VH with a tap at a midpoint 20 connected to the node 16. Particularly, the resistor 18 comprises a first resistor R1 connected in series with a second resistor R2 with a junction therebetween defining the midpoint 20. The midpoint or junction 20 is electrically connected to the node 16, which is the junction between the first varactor 12 and the second varactor 14. The resistance of the first resistor R1 is equal to the resistance of the second resistor R2.

The current through the resistors R1, R2 must be large enough that leakage has a negligible effect on the bias on the node 16, keeping it very close to V/2, but small enough to have a negligible impact on high frequency characteristics of the varactor circuit 10. As an example, if Ctot=12 pF, in CMOS7SF, then each of the series varactors 12, 14 would have a 24 pF capacitance. The total area of the varactor at 66% layout efficiency would be about 6000 uM2. The leakage current at 1.5 pA/uM2 which is the upper limit of the specifications would require 10 nA leakage immunity for the total structure. A 1 uA leakage current in the bleeder resistor would be sufficient to keep the potential close to V/2. At 2.5 volts, this adds a 2.5M-Ohm impedance in parallel with the varactors 12, 14. The impedance of the varactor at 1 GHz would be about 14 Ohms, so that the change is negligible.

Figure 3:
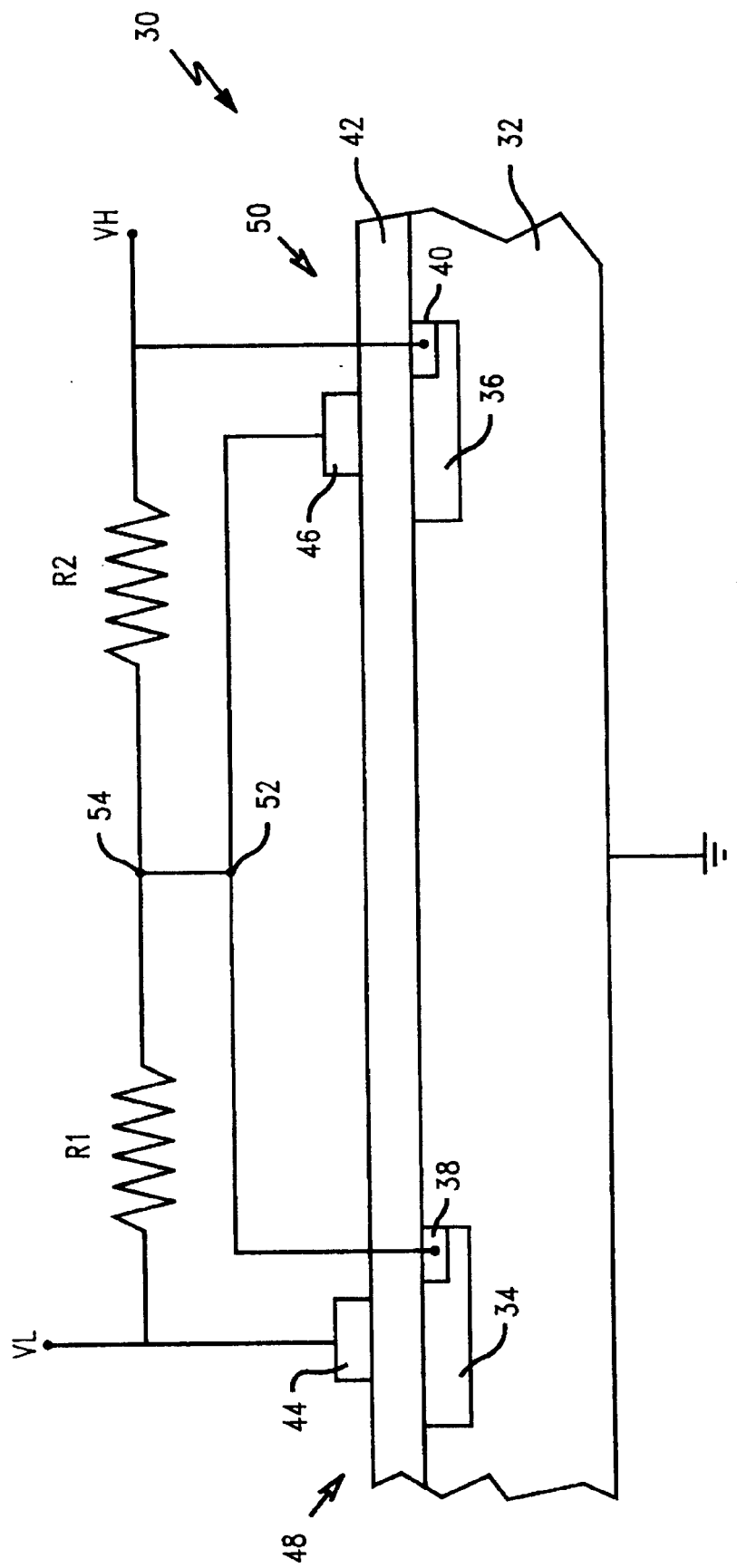
FIG. 3 is a cross sectional view of a MOS varactor device having an increased tuning range in accordance with the invention.

Referring to FIG. 3, a MOS varactor device 30 in accordance with the invention is illustrated. Particularly, the MOS varactor device uses the circuit of FIG. 2.

The varactor device 30 includes a substrate 32 having a first N-well 34 and a second N-well 36. The first N-well 34 includes an N-FET 38. The second N-well 36 includes an N-FET 40. An insulator layer 42 is applied over the substrate 32 overlying the N-wells 34 and 36. A first gate electrode is provided on the insulator layer 42 overlying the first N-well 34. A second gate electrode 46 is provided on the insulator layer 42 overlying the second N-well 36. The first gate conductor 44 in combination with the first N-well 34 and first N-FET 38 define a first varactor element 48. Similarly, the second gate element 46 in combination with the second N-well 36 and the second N-FET 40 define a second varactor element 50. As defined by the schematic of FIG. 2, the first N-FET 38 is electrically connected to the second gate element 46 via a node or a junction 52. The first gate element 44 is connected to the terminal VL. The second N-FET 40 is connected to the second terminal VH. The resistors R1 and R2 are connected in series between the terminals VL and VH with a junction 54 therebetween connected to the node 52.

In the illustrated embodiment of the invention, the varactor circuit includes two varactors connected in series to a double tuning voltage range. The result can be extended to use additional varactors in series if in the even larger tuning range is needed, as will be apparent to those skilled in the art.

What is claimed is:

1. A varactor circuit having an increased tuning range comprising:

a first varactor in series with a second varactor between first and second terminals; and a resistor connected between the first and second terminals, a tap of the resistor being connected to a junction of the first and second varactors.

2. The varactor circuit of claim 1 wherein the varactors comprise MOS varactors.

3. The varactor circuit of claim 2 wherein the varactors comprise an N-FET in an N-well.

4. The varactor circuit of claim 1 wherein a diffusion of the first varactor is connected to a gate of the second varactor.

5. The varactor circuit of claim 1 wherein the first terminal is a gate of the first varactor and the second terminal is a diffusion of the second varactor.

6. The varactor circuit of claim 1 wherein the resistor comprises a high value resistor.

7. The varactor circuit of claim 1 wherein the resistor comprises first and second series connected resistors having a junction defining the tap.

8. A MOS varactor device having an increased tuning range comprising:

a substrate;

a first varactor element on the substrate, the first varactor element having a gate and a diffusion;

a second varactor element on the substrate, the second varactor element having a gate and a diffusion, the first varactor element being connected in series with the second varactor element between first and second terminals; and a resistor element connected between the first and second terminals, a tap of the resistor element being connected to a junction of the first and second varactor elements.

9. The MOS varactor device of claim 8 wherein the varactor elements comprise an N-FET in an N-well.

10. The MOS varactor device of claim 8 wherein the diffusion of the first varactor element is connected to the gate of the second varactor element.

11. The MOS varactor device of claim 8 wherein the first terminal is the gate of the first varactor element and the second terminal is the diffusion of the second varactor element.

12. The MOS varactor device of claim 8 wherein the resistor element comprises a high value resistor.

13. The MOS varactor device of claim 8 wherein the resistor element comprises first and second series connected resistors having a junction defining the tap.

14. The MOS varactor device of claim 8 wherein the substrate defines a ground.

15. A variable capacitor having an increased tuning range comprising:

a first varactor in series with a second varactor between first and second terminals; and a first resistor in series with a second resistor connected between the first and second terminals, a junction of the first and second resistors being connected to a junction of the first and second varactors.

16. The variable capacitor of claim 15 wherein each varactor has a gate and a diffusion.

17. The variable capacitor of claim 16 wherein the diffusion of the first varactor is connected to the gate of the second varactor.

18. The variable capacitor of claim 15 wherein the first terminal is a gate of the first varactor and the second terminal is a diffusion of the second varactor.

19. The variable capacitor of claim 15 wherein the first and second resistors have equivalent resistance.

20. The variable capacitor of claim 15 wherein the first and second resistors have high resistance.

* * * * *